United States Patent
San Roman Alerigi (10) Patent No.: US 12,029,125 B2
(45) Date of Patent: Jul. 2, 2024

(54) METHODS TO HARVEST THERMAL ENERGY DURING SUBSURFACE HIGH POWER LASER TRANSMISSION

(71) Applicant: SAUDI ARABIAN OIL COMPANY, Dhahran (SA)

(72) Inventor: Damian Pablo San Roman Alerigi, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 18/081,184

(22) Filed: Dec. 14, 2022

(65) Prior Publication Data

US 2023/0116150 A1 Apr. 13, 2023

Related U.S. Application Data

(62) Division of application No. 16/880,390, filed on May 21, 2020, now Pat. No. 11,611,029.

(51) Int. Cl.
| | |
|---|---|
| *H10N 10/17* | (2023.01) |
| *G02B 6/02* | (2006.01) |
| *H10N 10/852* | (2023.01) |
| *H10N 10/856* | (2023.01) |

(52) U.S. Cl.
CPC ............. *H10N 10/17* (2023.02); *G02B 6/02* (2013.01); *H10N 10/852* (2023.02); *H10N 10/856* (2023.02)

(58) Field of Classification Search
CPC .... H10N 10/17; H10N 10/852; H10N 10/856; G02B 6/02; G02B 6/4296; E21B 47/114; E21B 47/135
See application file for complete search history.

(56) References Cited

U.S. PATENT DOCUMENTS

| | | | |
|---|---|---|---|
| 2003/0002548 A1* | 1/2003 | Boscha | G02B 6/4215 372/32 |
| 2006/0157239 A1* | 7/2006 | Ramos | E21B 47/135 166/254.2 |
| 2009/0173372 A1* | 7/2009 | Carroll | B82Y 30/00 136/262 |
| 2010/0200044 A1* | 8/2010 | Zaban | H01L 31/0549 136/246 |
| 2011/0284729 A1* | 11/2011 | Abouraddy | H01L 31/055 359/326 |
| 2012/0068086 A1* | 3/2012 | DeWitt | E21B 37/00 250/492.1 |

* cited by examiner

*Primary Examiner* — Devina Pillay
(74) *Attorney, Agent, or Firm* — Osha Bergman Watanabe & Burton LLP (57) ABSTRACT

A system includes a high-power laser surface unit capable of generating a high-power laser beam having an output power of at least 10 kW, an optical fiber connected to the high-power laser surface unit, and at least one harvesting cell disposed around the optical fiber. The optical fiber includes an optical cladding surrounding an optical fiber core. Each harvesting cell includes an anode, a cathode, and a thermoelectric layer disposed adjacent to and electrically connected to the anode and the cathode, where the thermoelectric layer includes a polymer-based thermoelectric material.

13 Claims, 8 Drawing Sheets

METHODS TO HARVEST THERMAL ENERGY DURING SUBSURFACE HIGH POWER LASER TRANSMISSION

RELATED APPLICATIONS

This application is a divisional application of U.S. application Ser. No. 16/880,390, filed on May 21, 2020, the entire contents of which are incorporated herein by reference.

BACKGROUND

Wellbore stimulation is a branch of petroleum engineering focused on ways to enhance the flow of hydrocarbons from a formation to the wellbore for production. To produce hydrocarbons from the targeted formation, the hydrocarbons in the formation need to flow from the formation to the wellbore in order to be produced and flow to the surface. The flow from the formation to the wellbore may depend on formation permeability. When formation permeability is low, stimulation is applied to enhance the flow. Stimulation can be applied around the wellbore and into the formation to build a network in the formation.

One method of well-bore stimulation uses a downhole laser tool to penetrate and ablate a hydrocarbon bearing formation. In such a system, a laser surface unit excites energy to a level above the sublimation point of a hydrocarbon bearing formation to form a high power laser beam. This high powered laser beam is transmitted from the laser surface unit to the desired downhole location via fiber optic cable. At the downhole end of the fiber optic cable, the laser beam enters a transformer, which directs and focuses the high power laser beam. Finally, the high power laser beam is discharged from the transformer to ablate the intended hydrocarbon bearing formation.

Figure 1:
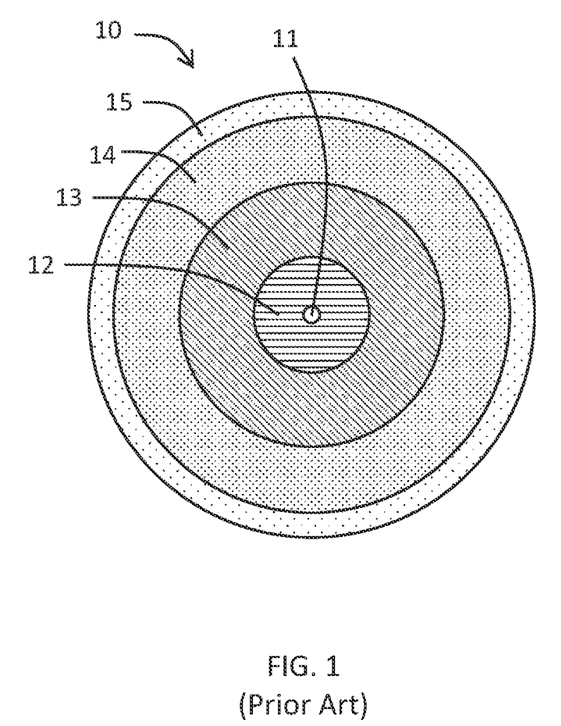
FIG. 1 shows a cross-sectional view along a radial plane through a conventional optical fiber.

Fiber optic cables are flexible and radiation-transparent waveguides designed to guide and confine the propagation of light. FIG. 1 shows a cross-sectional view of a typical fiber optic cable 10. There are two key elements: a) core 11, typically made of a dielectric material; and b) cladding 12, a material of lower refractive index (compared to the core) that encloses the core 11. Additionally, fibers 10 often incorporate: c) a buffer layer 13, to isolate the cladding 12 and the core 11 from the environment; d) a sheath 14, a protective layer that serves as coating for the fiber 10, further isolating it from the surrounding medium; and e) a jacket 15, an enclosure that completely isolates the fiber 10.

SUMMARY

In one aspect, embodiments of the present disclosure relate generally to optical fibers having an optical fiber core for high-power laser transmission, an optical cladding surrounding the optical fiber core, and at least one harvesting cell disposed around the optical cladding, the harvesting cell having an anode, a thermoelectric layer disposed adjacent to and electrically connected to the anode, and a cathode disposed adjacent to and electrically connected to the thermoelectric layer, where the thermoelectric layer includes a polymer-based thermoelectric material.

In another aspect, embodiments of the present disclosure relate to a system having a high-power laser surface unit capable of generating a high-power laser beam having an output power of at least 10 kW, an optical fiber connected to the high-power laser surface unit, the optical fiber comprising an optical cladding surrounding an optical fiber core, and at least one harvesting cell disposed around the optical fiber, where the harvesting cell includes an anode, a cathode, and a thermoelectric layer disposed adjacent to and electrically connected to the anode and the cathode, and where the thermoelectric layer includes a polymer-based thermoelectric material.

In yet another aspect, embodiments of the present disclosure relate to methods that include providing an optical fiber extending from a surface of a wellsite to a downhole location, transmitting a high-powered laser through the optical fiber from the surface to the downhole location, and harvesting thermal energy from the optical fiber during transmission of the high-powered laser.

Other aspects and advantages of the invention will be apparent from the following description and the appended claims.

DETAILED DESCRIPTION

Embodiments disclosed herein relate generally to harvesting energy ensuing from linear scattering (optical) and absorbed light (thermal) from an optical fiber. Energy harvested from optical fibers according to embodiments of the present disclosure may be used, for example, to power other downhole devices. Optical fibers disclosed herein may be used in oil and gas or other downhole applications, for example, in a downhole laser tool. Given the depth of a wellbore, a downhole laser tool may include a fiber optic cable that may be many kilometers meters long, such as 5 km, 20 km, or greater. Consequently, there may be moderate amounts of energy lost during transmission of the laser energy through such lengths of the fiber optic cable. Thus, one or more embodiments harvest this energy along a length of the fiber optic cable used in downhole applications. Once generated and collected at various points along the optical fiber, this electricity may be used to power downhole devices in the current or in a different downhole process.

In optical fibers, attenuation from the reduction in intensity of a light beam as it propagates through a medium occurs primarily from scattering and absorption. Linear scattering is a physical phenomenon exhibited by waves when they are deviated from their original trajectory into a path manifold due to localized defects or irregularities (e.g., particles) in the medium through which they propagate or due to the interface between two materials. Optical power losses due to scattering vary, although the losses may range from 1% per kilometer (%/km) (0.043 decibel per km (dB/km)) for naturally occurring $SiO_2$ up to 50%/km (2.2 dB/km) for fabrication quality $SiO_2$. Linear scattering frequently appears as laser light propagating outside of the optical core, such as in the cladding. Further, linear scattering can also introduce absorption losses.

Absorption occurs when the energy of a photon is absorbed by a material, typically via excitement of electrons within an atom. In this way, the photon's energy is transformed into potential energy in the atom, which may become thermal energy and heat the material. There are two regimes of absorption: 1) linear absorption, where the energy transfer does not depend on the intensity of the beam, only in its frequency; and 2) non-linear absorption, where absorption decreases with increasing light intensity. Non-linear absorption is often caused by transparency changes of the medium with increased light intensity, resulting in absorption saturation. Optical power losses in conventional silicon dioxide ($SiO_2$) optical fibers due to absorption may range from 17%/km (0.74 dB/km) up to 50%/km (2.2 dB/km). Specialty and hollow-core optical fibers also suffer from absorption losses, with the losses ranging from 1%/km (0.043 dB/km) up to 15%/km (0.65 dB/km). Absorption frequently appears as heating along the fiber.

Optical fibers according to embodiments of the present disclosure may include one or more harvesting cells made with a thermoelectric material built into the optical fiber to harvest thermal energy from attenuation of light through the optical fiber. One or more harvesting cells may be built into an optical fiber by providing a thermoelectric material in a position where a buffer layer and sheath would otherwise have been. Harvesting cells disclosed herein are thermoelectric devices that convert thermal energy incident on its surface into electrical energy in the form of power/voltage/current includes two electrodes, an anode and a cathode, with opposite electrical polarities and a thermoelectric material.

Figure 2A:
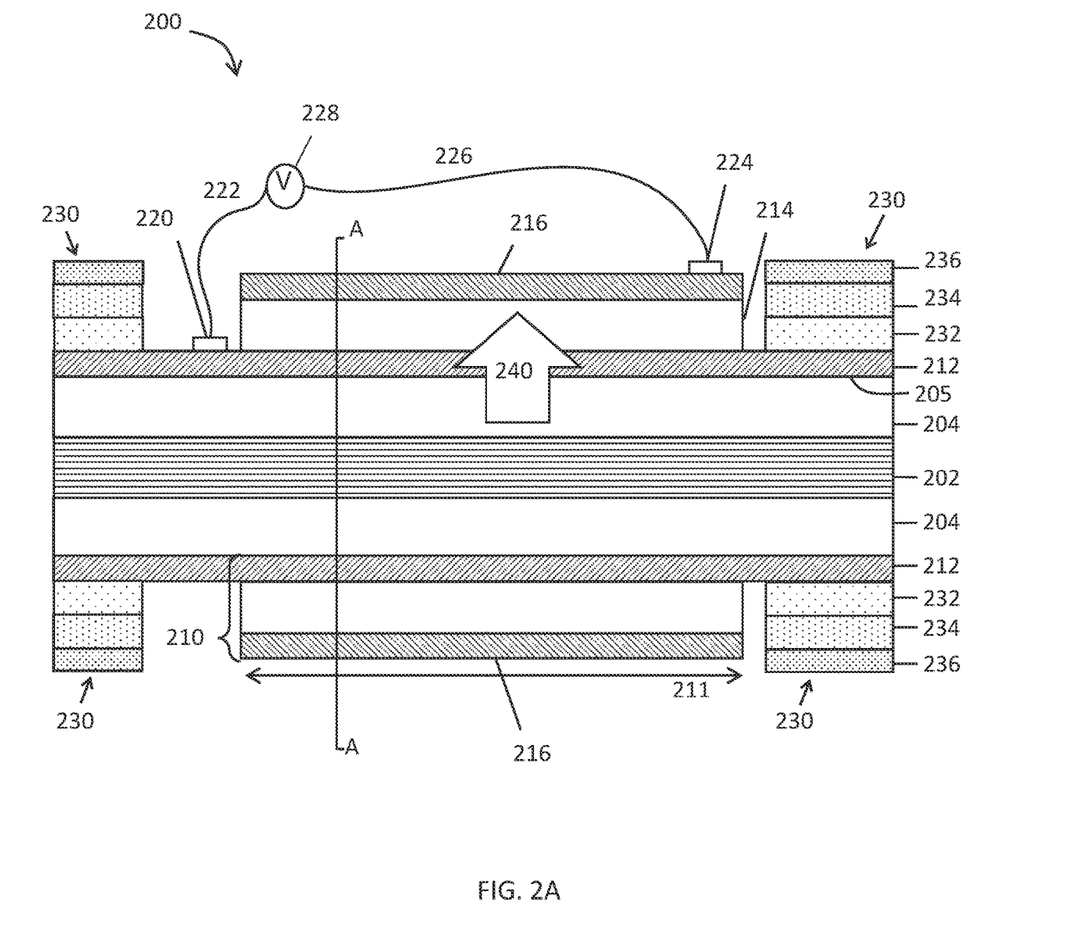
FIGS. 2A and 2B show cross-sectional views along an axial plane and radial plane, respectively, through an optical fiber according to embodiments of the present disclosure.
Figure 2B:
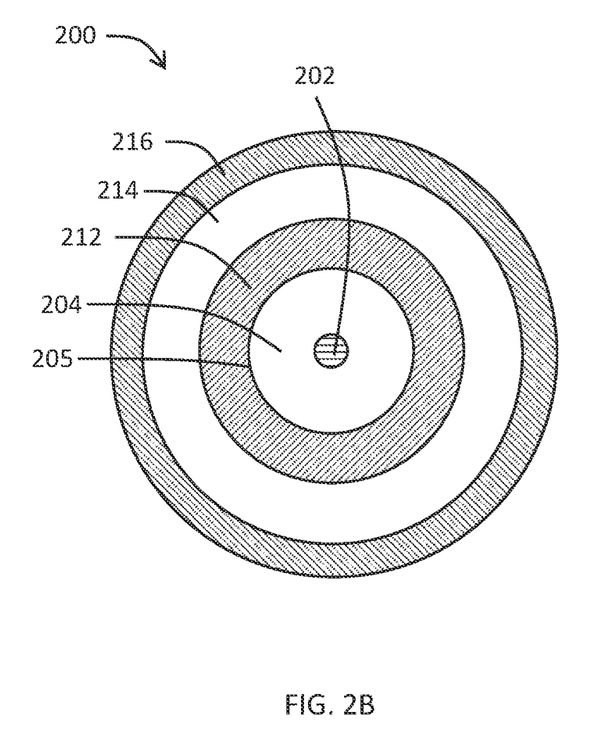

For example, FIGS. 2A and 2B show cross-sectional views of an optical fiber 200 according to embodiments of the present disclosure. FIG. 2A shows a cross-sectional view along an axial length of the optical fiber 200, and FIG. 2B shows a perpendicular cross-sectional view along section A-A in FIG. 2A. The optical fiber 200 includes an optical fiber core 202 and an optical cladding 204 surrounding the core 202. The cladding 204 may be disposed around and cover the entire outer perimeter of the core 202. The core 202 may be made of a dielectric material or material suitable for transmitting a high-power laser, such as silicon dioxide. In some embodiments, the core 202 may be formed of a glassy material such as silica glass, flouride glass, phosphate glass, fluorozirconate, fluoroaluminate, or chalcogenide glass. In some embodiments, the core 202 may be formed of a crystalline material such as silicon dioxide or sapphire (aluminum oxide).

The cladding 204 may be made of a material having a lower refractive index than the core 202. In some embodiments, the cladding 204 may be made of a semiconducting material. In some embodiments, the cladding may be formed from the same material as the core but with a slightly altered composition to adjust the refractive index. In some embodiments, the cladding 204 may be formed of a glassy material such as silica glass, flouride glass, phosphate glass, fluorozirconate, fluoroaluminate, or chalcogenide glass. In some embodiments, the cladding 204 may be formed of a crystalline material such as silicon dioxide or sapphire (aluminum oxide). The refractive index difference between core 202 and cladding 204 may be substantially one percent or may be less than one percent (for example, 0.75%, 0.5%, or 0.25%, and ranges in-between).

According to embodiments of the present disclosure, the core 202 and cladding 204 sizes may be designed for transmission of a high power laser (e.g., a laser having an output power of at least 10 kW, at least 20 kW, at least 100 kW, or in the megawatt range). For example, the core 202 may have a thickness (diameter) ranging from about 50 to 900 micrometers, and the cladding 204 may have a thickness, as measured from the outer perimeter of the core 202 to the outer perimeter of the cladding 204, ranging from about 150 micrometers to about 1 millimeter. Further, the length of the optical fiber 200, depending on the application, fabrication and material design, may reach several kilometers.

At least one harvesting cell 210 may be disposed around the optical cladding 204. The harvesting cell 210 includes an anode 212, a thermoelectric layer 214 disposed adjacent to and electrically connected to the anode 212, and a cathode 216 disposed adjacent to and electrically connected to the thermoelectric layer 214. In the embodiment shown, the anode 212, thermoelectric layer 214, and cathode 216 are in a layered arrangement where the thermoelectric layer 214 is sandwiched between the anode 212 and cathode 216. The anode 212 may extend a partial or entire length of the optical fiber 200 and extend radially partially or entirely around the outer perimeter of the optical cladding 204. The thermoelectric layer 214 may extend a partial length of the optical fiber 200 and extend radially partially or entirely around the outer perimeter of the anode 212. Further, the cathode 216 may extend a partial length of the optical fiber 200 and extend radially partially or entirely around the outer perimeter of the thermoelectric layer 214.

An anode 212 may be made of a p-type semiconductor. In the embodiment shown, the anode 212 is a layer adjacent to the optical cladding 204. In some embodiments, the optical cladding 204 may be formed from a p-type semiconductor and serves as the anode (where the cladding and anode are the same layer). Examples of suitable anode 212 material may include p-type doped silicon dioxide, such as ytterbium-doped silicon dioxide ($Yb:SiO_2$), or an alloy having good thermal and electrical conductivity. The anode 212 may have high thermal conductivity and capacity, which may carry thermal energy generated from attenuation of a transmitted light through the core 202 to the thermoelectric layer 214.

The thermoelectric layer 214 may be made of a polymer-based thermoelectric material. For example, the thermoelectric layer 214 may be made of a polymer-based thermoelectric material having at least one conductive polymer, such as polyacetylene (PA), polypyrrole (PPY), polythiophene (PTh), poly(3,4-ethylenedioxythiopene) (PEDOT), poly(3-hexylthiopene (P3HT), and polyaniline (PANI). Further, polymer-based thermoelectric material may include a thermoelectrically active nanomaterial, such as a chalcogenide and/or carbon nanotubes, embedded therein. Examples of nanoparticles that may be compounded with a polymer base may include PbTe, SnSe, SnTe, BiSbTe, $Bi_2Te_3$, $BaBiTe_3$, and carbon nanotubes.

A polymer for use in the thermoelectric layer 214 may be compounded with thermoelectrically active nanomaterials engineered to have a high Seebeck coefficient (S) (e.g., ranging from about 10 to $10 \times 10^{-6}$ $VK^{-1}$), low thermal conductivity ($\kappa$) (e.g., $10 \times 10^{-1}$ to $10 \times 10^{-5}$ $Wm^{-1}K^{-1}$), and high electrical conductivity ($\sigma$) (e.g., 10 to $10 \times 10^3$ $S\ cm_{-1}$). For example, polymers can be compounded with chalcogenides particles with an optimized Seebeck coefficient at high pressure. The thermoelectric material may be engineered to have a thermoelectric figure of merit (ZT) ranging from, for example, about $10 \times 10^{-1}$ to $10 \times 10^{1}$. In some embodiments, thermoelectric nanoparticles may be optimized to operate in conditions with pressures up to 10,000 psi and temperatures up to 200° C. The thermoelectric nanoparticles may be embedded within a polymer base of a thermoelectric layer 214 and coated around an optical fiber 200, as described herein, to take advantage of the thermal gradients produced during laser propagation.

A cathode 216 may be made of an n-doped carbon or metal compound, such as Aluminum (Al), Cadmium (Cd), or Tellurium (Te). In some embodiments, a cathode may be constructed in layers of the same material with declining doping. Dopants may include, for example, Aluminum (Al), Cadmium (Cd), or Selenide ($Se^{-2}$). The cathode 216 may act as both a shield for the optical fiber and a conductor. In some embodiments, an additional dielectric layer may be deposited on top of the cathode 216 to provide insulation.

The depicted harvesting cell 210 includes a multiple concentric layers surrounding optical fiber core 202 that may augment or replace one or more of the cladding, a buffer layer, a sheath, and a jacket in a conventional fiber optic cable (e.g., shown in FIG. 1). Surrounding optical fiber core 202, in order from the radially center core 202 to the radially outermost part of the optical fiber 200 around the harvesting cell 210, is the cladding 210 surrounding the core 202, the anode 212, the thermoelectric layer 214, and the cathode 216. Additionally, a first contact 220 and wire 222 may be connected to the anode 212 and a second contact 224 and wire 226 may be connected to the cathode 216. The two wires 222, 226 may connect to a voltmeter 228 to close the circuit. Each of these as well components are further described in detail.

In the embodiment shown, the harvesting cell 210 may be located and axially spaced (e.g., with enough room for a contact 220 and wire 222 to access the anode 212) between portions of concentrically layered protective layers 230 including a buffer layer 232, sheath 234, and/or jacket 236 (where any of the buffer layer 232, sheath 234, and jacket 236 are optional). For example, a conventionally configured optical fiber having a core, a cladding layer disposed radially around the outer surface of the core, and one or more protective layers formed radially around the outer surface of the cladding (e.g., a buffer layer around the cladding, a sheath around the buffer layer, and a jacket around the sheath, or a configuration where the buffer, sheath and/or jacket may be combined or omitted) may have axial portions of the protective layer(s) replaced with one or more harvesting cells 210. In some embodiments, protective layers such as conventionally formed buffer layers, sheaths, and jackets may be entirely absent from around the cladding 204, where harvesting cells 210 may instead be positioned radially surrounding the cladding 204 along a portion or substantially the entire length of the optical fiber 200.

A harvesting cell 210 may have an axial length 211 ranging from the centimeter scale (e.g., 10 cm to 100 cm or more) to the meter scale (e.g., 1 m to 10 m or more). Thus, in embodiments having harvesting cells 210 covering a substantial axial length of an optical fiber 200 for use downhole, which can have axial lengths in the kilometer range, multiple harvesting cells 210 may be disposed along the optical fiber 200. The length of each harvesting cell 210 may vary depending on, for example, the application, fiber length, power requirements, and design parameters.

According to some embodiments of the present disclosure, the optical fiber 200 may further be encapsulated by an insulating layer. For example, an insulating layer may be applied over the harvesting cells 210 and any protective layers 230, where the insulating layer may form the radially outermost layer from the core 202. In some embodiments, an insulating layer may be formed by an encapsulating conduit (e.g., a carbon or metal tube) through which the optical fiber 200 extends, where the encapsulating conduit may be filled with an insulating gel (e.g., a polymer) or gas (e.g., $N_2$ or $O_2$).

The harvesting cell 210 may generate electric current from light absorbed from an optical fiber core 202. As light propagates through the core 202 of the optical fiber 200, a portion of the light will be absorbed into the cladding 204, thereby creating a thermal gradient 240 along a length of the optical fiber 200. A polymer-based thermoelectric material used in the thermoelectric layer 214 may generate a voltage difference from the thermal gradient 240, where the anode 212 and cathode 216 may be positioned at opposite sides of a thermoelectric layer 214 and connected to create a voltage difference. In such manner, thermoelectric energy generation may result from the conversion of thermal gradients into electric potentials.

To improve thermal extraction, and enhance harvesting, the cladding 204 can be texturized to increase absorption. For example, the outer surface 205 of the cladding 204 may be modified to have periodic shapes in the formed of relatively raised and lowered portions, including, for example, ribs/ridges and sinusoids. Different techniques may be used to create and optimize a textured outer surface 205 of the cladding 204. By texturizing the outer surface 205 of the cladding 204, the surface area of the outer surface 205 may be increased, which in turn helps to increase the amount of absorption and improve thermal extraction.

An optical fiber 200 may have a single harvesting cell 210 or multiple harvesting cells 210 (each harvesting cell 210 including concentric layers of anode 212, thermoelectric material 214, and cathode 216). In some embodiments, multiple harvesting cells 210 may be disposed next to each other (with enough room between the harvesting cells 210 for a contact 220 and wire 222 to access the anode 212), and may be connected in series or parallel (e.g., via electrical circuit connections) depending on the application and length of the optical fiber 200.

Figure 3:
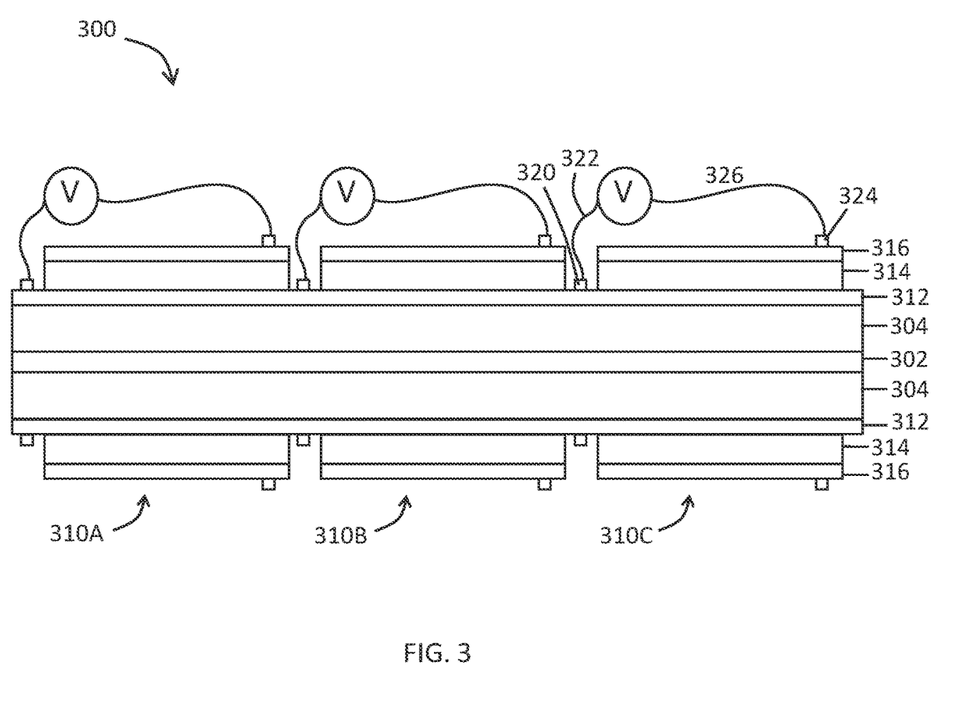
FIG. 3 shows a cross-sectional view along an axial plane through an optical fiber according to embodiments of the present disclosure.

For example, FIG. 3 shows an example of an optical fiber 300 having a plurality of harvesting cells 310A, 310B, 310C (collectively referred to as 310) electrically connected together in parallel. The optical fiber 300 has a core 302 extending axially through its entire length and a cladding 304 disposed radially around the outer surface of the core 302. Multiple harvesting cells 310 may be positioned along the optical fiber 300 at different axial locations, where each harvesting cell 310 is formed of an anode 312 disposed radially around the outer surface of the cladding 304, a thermoelectric layer 314 disposed radially around the anode 312, and a cathode 316 disposed radially around the thermoelectric layer 314. The anode 312 may be a layer of thermally and electrically conducting material that entirely coats the cladding 304, or the anode may be disposed around the cladding 304 in axial sections with the harvesting cells 310 (having spacing between separate anode sections). In either configuration, the anode 312 may be disposed adjacent to and between the optical cladding 304 and the thermoelectric layer 314. Around each harvesting cell 310 a first connector 320 and wire 322 may be electrically connected to the anode 312 and a second connector 324 and wire 326 may be electrically connected to the cathode 316. In other words, as shown in FIG. 3, each harvesting cell 310 has a first connector 320 and wire 322 electrically connected to the anode 312 and a second connector 324 and wire 326 electrically connected to the cathode 316. In such manner, the harvesting cells 310 may be electrically connected in parallel.

Figure 4:
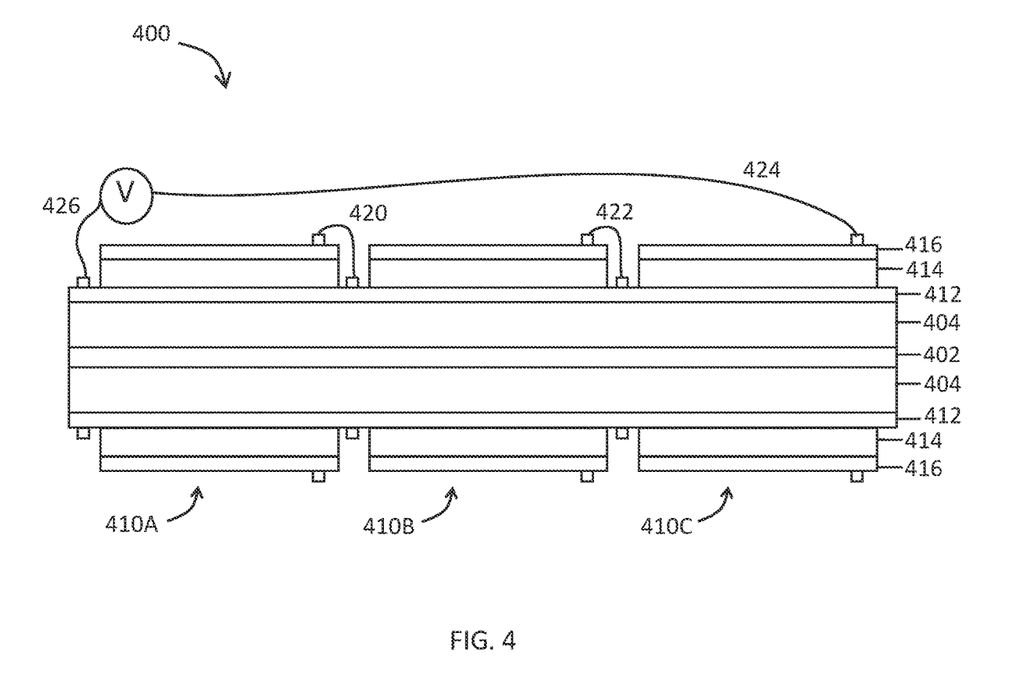
FIG. 4 shows a cross-sectional view along an axial plane through an optical fiber according to embodiments of the present disclosure.

FIG. 4 shows an example of an optical fiber 400 having a plurality of harvesting cells 410A, 410B, 410C (collectively referred to as 410) electrically connected together in series. The optical fiber 400 has a core 402 extending axially through its entire length and a cladding 404 disposed radially around the outer surface of the core 402. Multiple harvesting cells 410 may be positioned along the optical fiber 400 at different axial locations, where each harvesting cell 410 is formed of an anode 412 disposed radially around the outer surface of the cladding 404, a thermoelectric layer 414 disposed radially around the anode 412, and a cathode 416 disposed radially around the thermoelectric layer 414. The harvesting cells 410 may be electrically connected in series, where a first wire 420 may be electrically connected from the cathode 416 on a first harvesting cell 410A to the anode 412, a second wire 422 may be electrically connected from the cathode 416 on a second harvesting cell 410B to the anode 412, and the cathode 416 on a third harvesting cell 410C may be electrically connected to the anode 412 via wires 424, 426.

The circuit between harvesting cells 410 may be closed, where the voltage difference between the anode 412 and cathodes 416 of each harvesting cell 410 may be, for example, stored in batteries or used to power low-power sensors along the optical fiber 400. The electrical power can be used, for example, to manipulate rotors, beam stirrers, and other elements of an optical bottom hole assembly. The performance of polymer heterojunctions and thermoelectric materials may be affected by temperature, pressure, and chemical composition of the environment in which the optical fiber 400 is operating in (e.g., in a downhole environment). Thus, by monitoring the performance of the polymer heterojunctions and thermoelectric materials from the harvesting cells 410, changes in the surrounding environment may be detected in situ, where controlled measurements of the harvesting cells 410 performance may be correlated with various changes in the surrounding environment (such as changes in pressure, temperature or chemical composition).

Other arrangements of harvesting cells may be provided around an optical fiber to harvest energy from absorption as portions of light escape from the fiber's core during transmission of a laser. Harvesting cells, defined by an anode, thermoelectric material, and a cathode, may be arranged along the length of the optical fiber, where the anode and cathode may be positioned around thermoelectric material in a manner to where the anode is at one end of a potential thermal gradient during operation of the optical fiber, and the cathode is at an opposite end of the potential thermal gradient during operation of the optical fiber. For example, an anode, thermoelectric layer, and cathode may be radially layered around a fiber cladding (or core), where the anode and cathode are disposed on opposite sides of a thermoelectric layer to be positioned at opposite sides of a thermal gradient formed radially from a core of the optical fiber to an outer surface of the optical fiber. Other arrangements of an anode and cathode around a thermoelectric layer may be used to provide the anode and cathode at opposite sides of a thermal gradient through the thermoelectric layer (e.g., whether the thermal gradient extends radially from the core of the fiber, axially along the fiber, or a combination of radial/axial orientation).

Figure 5A:
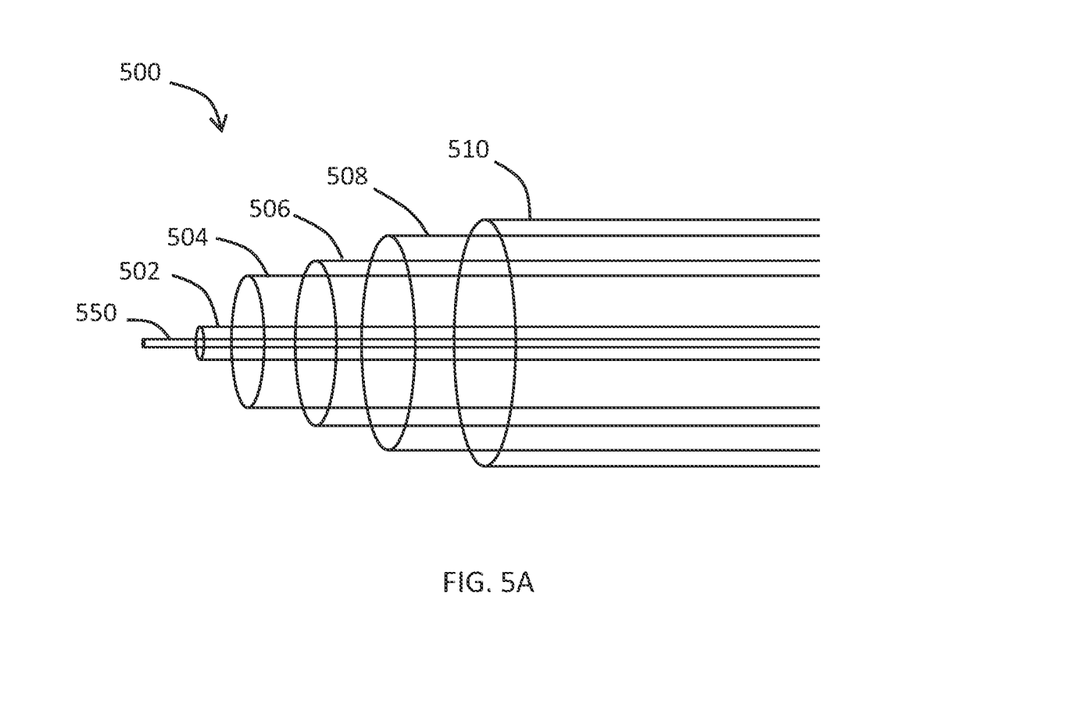
FIG. 5A shows a deconstructed view of an optical fiber according to embodiments of the present disclosure.
Figure 5B:
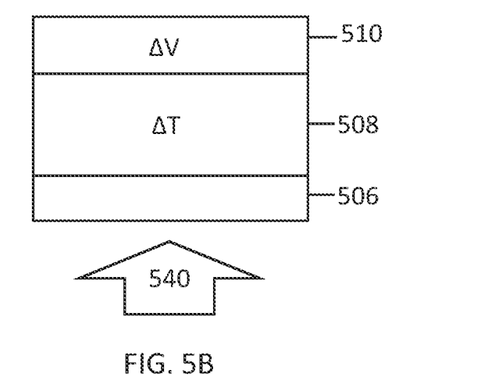
FIG. 5B shows a partial cross-sectional view of the optical fiber shown in FIG. 5A along a radial plane through the optical fiber.

FIGS. 5A and 5B shows another example of an optical fiber 500 capable of harvesting thermal energy during a laser 550 transmission through the core 502 of the optical fiber 500. A deconstructed view of the optical fiber 500 is shown in FIG. 5A, and a diagram of the energy harvesting from the optical fiber 500 is shown in FIG. 5B. The optical fiber 500 has an optical core 502, a cladding 504 layered concentrically around the core 502, a substrate 506 layered concentrically around the cladding 504, a thermoelectric material 508 layered concentrically around the substrate 506, and anode and cathode materials deposited in a top layer 510 around the thermoelectric material 508. The substrate 506 may be formed of a thermally conductive material (e.g., polymer or metal having a thermal conductivity ($\kappa$) greater than 1 $Wm^{-1}K^{-1}$), and may be made of the same or different material as the cladding 504. The anode material and cathode material may be electrically connected in such a way that create a single voltage difference across the entire length of the optical fiber 500, or discontinuously providing multiple voltage difference points across the optical fiber 500. As shown in FIG. 5B, as light from the laser is absorbed through the cladding 504 and heat transfers 540 to the substrate 506, a temperature gradient $\Delta T$ is formed through the thermoelectric material 508. A voltage difference $\Delta V$ between the anode and cathode material from the temperature gradient $\Delta T$ may be collected and stored, for example, in batteries, or used to power one or more downhole devices proximate the optical fiber 500.

Optical fibers disclosed herein may be used in downhole operations for the transmission of high-powered lasers, e.g., laser beams having an output power of at least 10 kW. For example, a laser well-bore stimulation process may require a high-power laser beam in order to penetrate the hydrocarbon bearing formations of interest. This process may require a laser beam having an average optical power output of more than 1 kilowatt (kW) or having a power density of approximately $10^9$ to $10^{15}$ watts per centimeter-squared ($W/cm^2$). A laser beam generator used to generate the laser may include any type of laser unit capable of generating such high-power laser beams that can be conducted through fiber optic cable. A laser beam generator may generate, for example, lasers of ytterbium, erbium, neodymium, dysprosium, praseodymium, and thulium ions. In some embodiments, the laser beam generator may generate a type of fiber laser capable of delivering a laser at a minimum loss through the optical fiber.

The wavelength of a laser beam from a laser beam generator may be set for a selected application, such as for a laser drilling application. For example, the wavelength may correspond to a resonant frequency of a fluid molecule, or a harmonic of that resonant frequency, in applications where contact with the laser beam to a wellbore fluid in a hydrocarbon-bearing formation produces plasma. In some implementations, the wavelength may be between 950 nanometers (nm) and 1000 nm. In some implementations, the wavelength may be between 960 nm and 980 nm. In some implementations, the wavelength is set to a principal resonant frequency of water.

In some embodiments, an optical fiber according to embodiments of the present disclosure may be run through downhole tubing (e.g., within the wall of the tubing), which may be used in a downhole operation such as drilling.

Figure 6A:
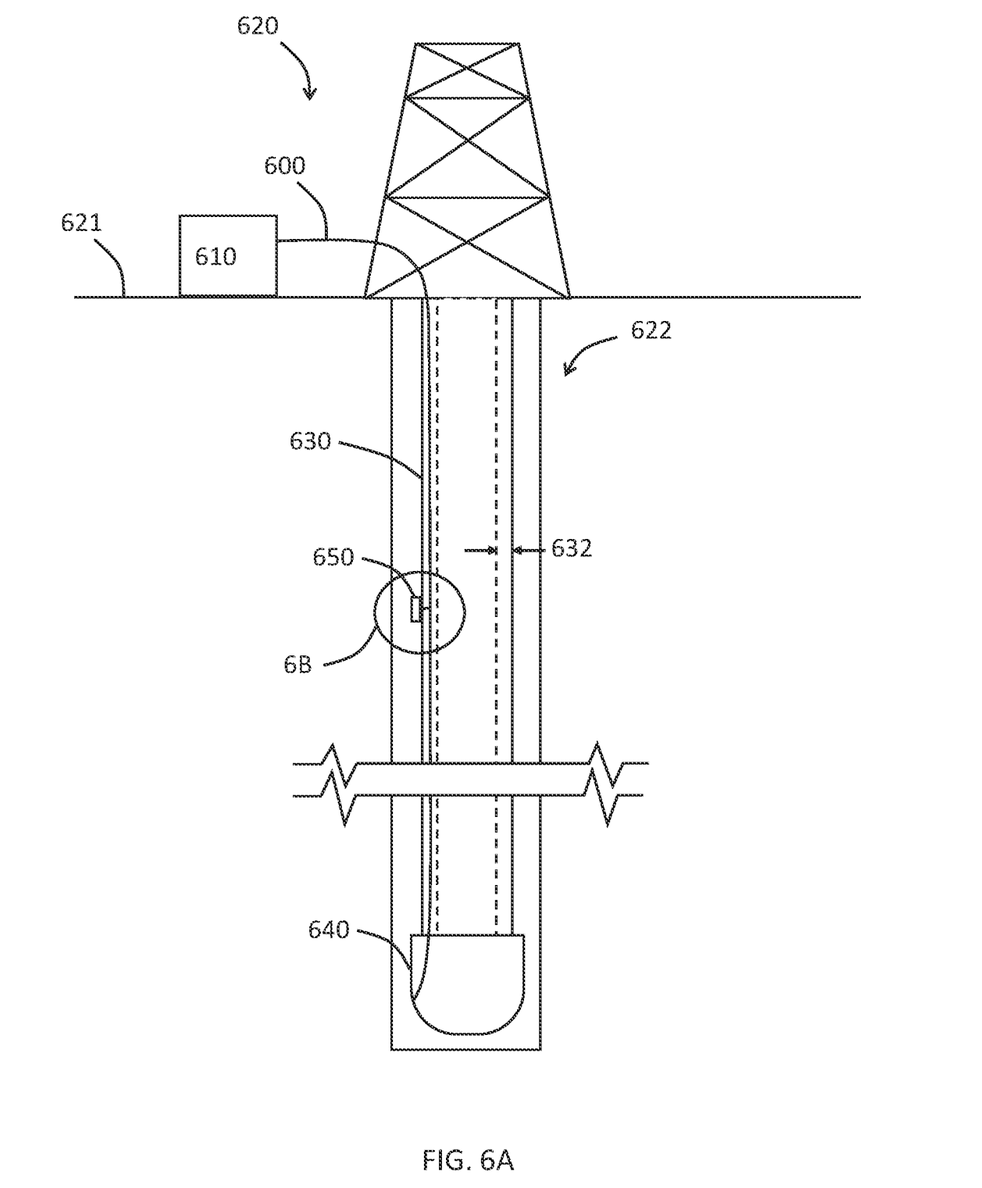
FIG. 6A shows a system using an optical fiber according to embodiments of the present disclosure.

FIG. 6 shows an example of a system using an optical fiber 600 according to embodiments of the present disclosure. The system may include a laser beam generator 610 such as a high-power laser surface unit capable of generating a high-power laser beam, e.g., laser beams having an output power of at least 10 kW. In some implementations, a laser beam generator 610 can be any type of laser generator configured to output a laser beam at a minimum loss. The laser beam generator 610 may be external to a wellbore, for example, at the surface 621 of a wellsite 620 outside of the well 622.

Figure 6B:
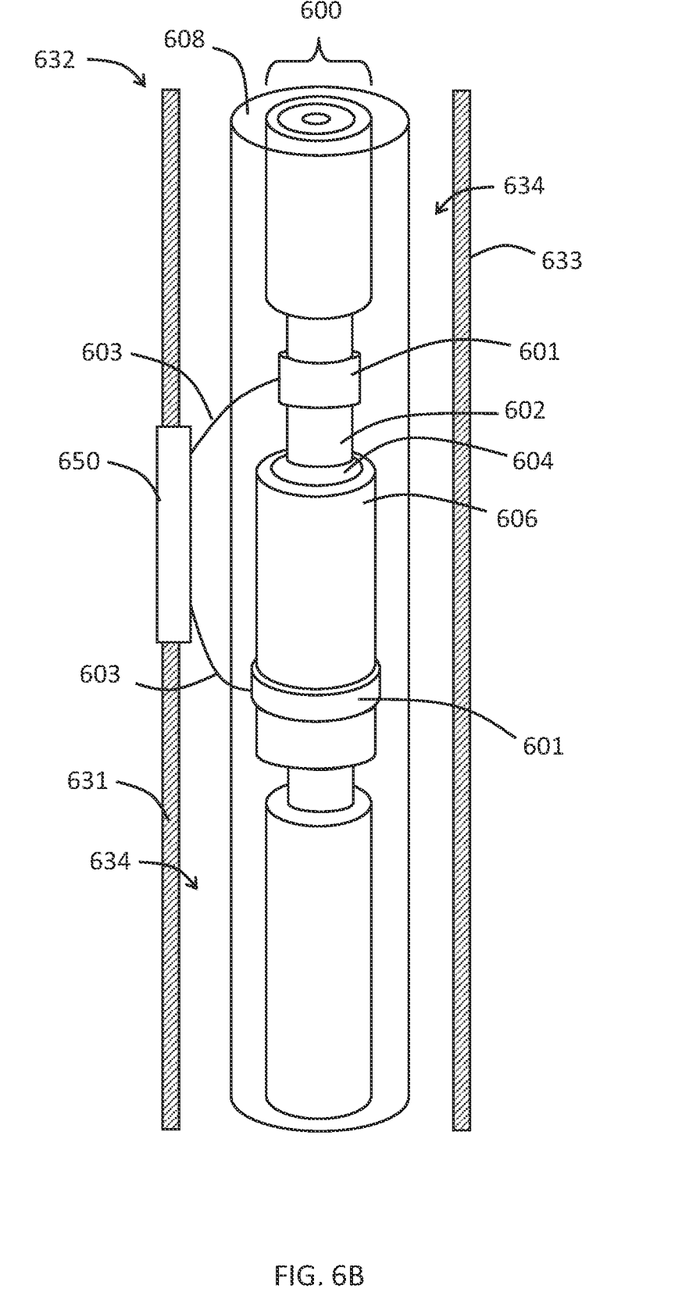
FIG. 6B shows a zoomed in view of the optical fiber in the system of FIG. 6A.

An optical fiber 600 according to embodiments disclosed herein may be connected to the laser beam generator 610, where the optical fiber 600 may be formed of an optical cladding surrounding an optical fiber core and at least one harvesting cell disposed around the optical fiber (e.g., such as described with reference to FIGS. 2A-5B). For example, as best shown in FIG. 6B, a harvesting cell may include an anode 602, a cathode 606, and a thermoelectric layer 604 disposed adjacent to and between the anode 602 and cathode 606. The thermoelectric layer 604 may be made of, for example, a polymer-based thermoelectric material having at least one conductive polymer compounded with a thermoelectrically active nanomaterial selected from at least one of a chalcogenide and a carbon nanotube.

The optical fiber 600 may extend from the laser beam generator 610 at the surface 621 of the wellsite 620 to a downhole location. For example, in a laser drilling operation, the optical fiber 600 may extend to the bottom of the well 622, and may be integrated with or attached to a downhole drilling device 640 for drilling the well 622.

In some embodiments, the optical fiber 600 may extend downhole through the wall 632 of downhole tubing 630 (e.g., coiled tubing). As best shown in FIG. 6B, the wall 632 of a tubing 630 may be formed of an outer wall 631 and an inner wall 633, where a gap or spacing 634 may be provided between the outer wall 631 and the inner wall 633. The spacing 634 may form a conduit through which the optical fiber 600 may extend from the surface 631 along the entire axial length of the tubing 630. In some embodiments, high-pressure gas such as $N_2$ and $O_2$ may be injected into the spacing 634 around the optical fiber 600.

According to embodiments of the present disclosure, the optical fiber 600 may also be encapsulated by an insulating layer 608, which may be formed, for example, of a carbon or metal outer casing filled with an insulating gel. The insulating layer 608 may be made of a chemically-resistant insulator material that maintains electrical isolation between the electrical connections 601, 603 from the anode 602 and cathode 606 at downhole temperature and pressure. Suitable insulator material may include but is not limited to halogenated elastomers such as fluoroelastomers, fluorosilicones, perfluoroelastomers, and tetra-fluoroethylene/propylene.

By surrounding the optical fiber 600 with an insulating layer 608 and/or filling the conduit 634 through the tubing 630 in which the optical fiber 600 is held with a gas, the surrounding of the optical fiber 600 (e.g., the outer surfaces of the anode 602 and cathode 606) may be colder than both the downhole environment and the thermal energy created by light absorption when portions of a transmitted laser escape from the fiber core. In such manner, a thermal gradient may be created through the optical fiber 600, which the thermoelectric layer 604 in the harvesting cell(s) may convert to electrical potential.

Electrical connections, including, for example, contacts 601 around the anode 602 and cathode 606 and wires 603 may be electrically connected to one or more harvesting cells disposed along the optical fiber 600. The electrical connections 601, 603 may electrically connect the harvesting cell(s) of the optical fiber 600 to one or more downhole devices 650 to provide power to the downhole device(s) 650. As shown, the electrical connections (e.g., wires 603) may extend through the insulating layer 608 to a surrounding downhole device 650.

A downhole device 650 powered by thermal energy harvesting from the optical fiber 600 may include, for example, a downhole sensor, e.g., temperature sensor, pressure sensor, flow meter, or any other sensor that may monitor a downhole condition. In this manner, optical fibers 600 according to embodiments of the present disclosure may provide power to one or more components downhole from transmission of a laser through the optical fiber 600. In the embodiment shown, the downhole device 650 may be a sensor positioned along the outer wall 631 of the tubing wall 632, such that the sensor may detect one or more conditions of the downhole environment surrounding the tubing 630.

According to embodiments of the present disclosure, methods of thermal energy harvesting during a downhole operation may include providing an optical fiber 600 extending from a surface 621 of a wellsite 620 to a downhole location (e.g., through downhole tubing or other conduit), transmitting a high-powered laser through the optical fiber 600 from the surface 621 to the downhole location, and harvesting thermal energy from the optical fiber 600 during transmission of the high-powered laser. Thermal energy may be harvested from the optical fiber 600 using harvesting cells (formed of an anode 602, thermoelectric layer 604, and cathode 606) disposed along the length of the optical fiber 600. A voltage difference may be generated from the thermal gradient created through the thermoelectric layer 604 in the harvesting cell(s), and the voltage may be used to power one or more downhole devices 650, depending on, for example, the power requirements for operation of the downhole device, the amount and size of the harvesting cell(s) used to power the downhole device, and the thermal gradient created through the harvesting cell(s).

In some embodiments, the amount of thermal energy harvested from the optical fiber 600 may be monitored, and changes in the amount of thermal energy harvested may be correlated to changes in at least one downhole condition (e.g., temperature, pressure, and environmental chemical composition). For example, thermal energy harvested from the optical fiber 600 may be monitored by monitoring the amount of power produced from the harvesting cell(s) along the optical fiber 600. Monitoring the amount of power produced may be done, for example, using voltmeters electrically connected between the anode 602 and cathode 606 of the harvesting cell(s) and/or monitoring operation of devices (e.g., if the device is working or not) electrically connected between the anode 602 and cathode 606 of the harvesting cell(s).

In an example of correlating thermal energy harvested with changes in a downhole condition, the temperature at a downhole location may be monitored. In such example, a downhole device may be electrically connected to one or more harvesting cells along an optical fiber at the downhole location. The operation of the downhole device (e.g., a sensor or a voltmeter) may be monitored to determine any changes in the amount of power being supplied to it from the electrically connected harvesting cells. Changes in the amount of power being supplied to the downhole device from the harvesting cells may correlate to a change in the thermal gradient formed through the optical fiber, where a change in the thermal gradient formed through the optical fiber may be caused by a change in the surrounding environmental temperature. One or more other temperature monitoring means may be used as confirmation or calibration for monitoring the temperature at the downhole location around the device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
a high-power laser surface unit capable of generating a high-power laser beam having an output power of at least 10 kW;
an optical fiber connected to the high-power laser surface unit and extending a length from the high-power laser surface unit, the optical fiber comprising an optical cladding surrounding an optical fiber core; and
at least one harvesting cell disposed around the optical fiber and positioned along the length of the optical fiber, the harvesting cell comprising:
an anode;
a cathode; and
a thermoelectric layer disposed adjacent to and electrically connected to the anode and the cathode, the thermoelectric layer comprising a polymer-based thermoelectric material,
wherein the harvesting cell is arranged to generate electrical energy from heat generated by linear scattering and absorptive losses within the optical fiber during high-power laser transmission, and wherein the polymer-based thermoelectric material comprises at least one conductive polymer compounded with a chalcogenide thermoelectrically active nanomaterial.

2. The system of claim 1, wherein the harvesting cell is disposed adjacent to the optical cladding.

3. The system of claim 1, wherein the anode is disposed adjacent to and between the optical cladding and the thermoelectric layer.

4. The system of claim 1, further comprising at least one downhole component electrically connected to the at least one harvesting cell,
wherein the downhole component is powered by the electrical energy generated by the harvesting cell from the linear scattering and absorptive losses of the laser beam.

5. The system of claim 1, wherein the length of the optical fiber ranges between 5 and 20 kilometers.

6. The system of claim 1, wherein the optical cladding is made of a semiconducting material having a lower refractive index than the optical fiber core.

7. The system of claim 1, wherein the optical cladding is texturized.

8. The system of claim 1, wherein the high-power laser surface unit is provided at a surface of a wellsite, and wherein the optical fiber extends into a well at the wellsite.

9. The system of claim 8, wherein the optical fiber extends through a wall of downhole tubing in the well.

10. A system, comprising:
a high-power laser surface unit capable of generating a high-power laser beam having an output power of at least 10 kW;
an optical fiber connected to the high-power laser surface unit, the optical fiber comprising optical fiber core; and
at least one harvesting cell disposed around the optical fiber, the harvesting cell comprising:
an anode comprising a p-type semiconductor and forming an optical cladding directly adjacent to and surrounding the optical fiber core along a length of the optical fiber;
a thermoelectric layer disposed adjacent to and electrically connected to the anode, the thermoelectric layer comprising a polymer-based thermoelectric material; and
a cathode disposed adjacent to and electrically connected to the thermoelectric layer,
wherein the harvesting cell is arranged to generate electrical energy from heat generated by linear scattering and absorptive losses within the optical fiber during high-power laser transmission, and wherein the polymer-based thermoelectric material comprises at least one conductive polymer compounded with a chalcogenide thermoelectrically active nanomaterial.

11. The system of claim 10, further comprising electrical connections electrically connecting the at least one harvesting cell to an external circuit in a downhole device,
wherein the downhole component is powered by the electrical energy generated by the harvesting cell from the linear scattering and absorptive losses of the laser beam.

12. The system of claim 10, wherein the high-power laser surface unit is provided at a surface of a wellsite, and wherein the optical fiber extends into a well at the wellsite.

13. The system of claim 12, wherein the optical fiber extends through a wall of downhole tubing in the well.

* * * * *